United States Patent
Horng

(10) Patent No.: US 6,493,241 B1
(45) Date of Patent: Dec. 10, 2002

(54) EMI PROTECTIVE SPRING PLATE FOR MOTHERBOARD

(76) Inventor: Chin Fu Horng, No. 9, Lane 90, Fu Hsing Rd., Lu Chou City, Taipei Hsiang (TW)

( * ) Notice: Subject to any disclaimer, the term of this patent is extended or adjusted under 35 U.S.C. 154(b) by 0 days.

(21) Appl. No.: 09/888,487

(22) Filed: Jun. 26, 2001

(51) Int. Cl.[7] .................................................. H05K 9/00
(52) U.S. Cl. ....................................... 361/818; 206/719
(58) Field of Search ......................... 307/91; 361/818; 257/659; 206/719; 436/610

(56) References Cited

U.S. PATENT DOCUMENTS 4,386,819 A * 6/1983 Asick et al. ................. 439/610
5,530,783 A * 6/1996 Belopolsky et al. .......... 385/53

* cited by examiner

Primary Examiner—Shawn Riley
(74) Attorney, Agent, or Firm—Rosenberg, Klein & Lee

(57) ABSTRACT

An EMI protective spring plate having an oblique supporting portion diagonally connected between a flat top contact portion and a flat bottom soldering portion, a front sliding portion obliquely downwardly extended from one end of the flat top contact portion toward the flat bottom soldering portion and inserted through a lower slot in the oblique supporting portion, and a rear sliding portion obliquely upwardly extended from one end of the flat bottom soldering portion toward the flat top contact portion and inserted through an upper slot in the oblique supporting portion.

11 Claims, 8 Drawing Sheets

EMI PROTECTIVE SPRING PLATE FOR MOTHERBOARD

BACKGROUND OF THE INVENTION

The present invention relates to an EMI protective spring plate for motherboard and, more particularly, to such an EMI protective spring plate, which has a lower dead point design that prevents permanent deformation.

In order to protect a motherboard against EMI (electromagnetic interference), spring plates may be installed in the border of the motherboard to support a plate shield. FIGS. From 1 through 3 show a spring plate constructed according to the prior art for this purpose. This structure of spring plate 10a comprises a flat top contact portion 11a, which supports a shielding cover plate 40a, a flat bottom soldering portion 15a, which is soldered to the motherboard 30a with tin soldering paste 20a, two side plate portions 14 vertically downwardly extended from two ends of the flat top contact portion 11a, an intermediate supporting portion 12a obliquely connected between the flat top contact portion 11a and the flat bottom soldering portion 15a, an upper turn R1a connected between the flat top contact portion 11a and the intermediate supporting portion 12a, a second turn R2a connected between the intermediate supporting portion 12a and the flat bottom soldering portion 15a, and two slots 13a respectively formed in the first turn R1a and the second turn R2a. This structure of spring plate 10a is still not satisfactory in function. Because the spring plate 10a has a substantially S-shaped profile, it may hook other objects during its installation in the motherboard 30a, thereby causing a deformation. Because a stress is produced during the formation of the first turn R1a and the second turn R2a, the flat top contact portion 11a and the first turn R1a are forced downwards at different extents upon loading of the shielding cover plate 40a, thereby causing the shielding cover plate 40a unable to be stably supported on the flat top contact portion 11a. Unstable contact between the plate shield 40a and the flat top contact portion 11a affects the EMI protective effect of the shielding cover plate 40a. Further, the spring plate 10a may be deformed permanently when received a high pressure.

SUMMARY OF THE INVENTION

The present invention has been accomplished to provide an EMI protective spring plate, which eliminates the aforesaid drawbacks. It is one object of the present invention to provide an EMI protective spring plate, which does not hook other objects during its installation. It is another object of the present invention to provide an EMI protective spring plate, which keeps the loaded EMI protective shielding cover plate stably in balance. It is still another object of the present invention to provide an EMI protective spring plate, which has a lower dead point design that prohibits the spring plate from being deformed excessively. To achieve these and other objects of the present invention, the EMI protective spring plate comprises a flat top contact portion, a flat bottom soldering portion, an oblique supporting portion diagonally connected between the flat top contact portion and the flat bottom soldering portion, a front sliding portion obliquely downwardly extended from one end of the flat top contact portion toward the flat bottom soldering portion and inserted through a lower slot in the oblique supporting portion, and a rear sliding portion obliquely upwardly extended from one end of the flat bottom soldering portion toward the flat top contact portion and inserted through an upper slot in the oblique supporting portion.

DETAILED DESCRIPTION OF THE PREFERRED EMBODIMENT

Figure 1:
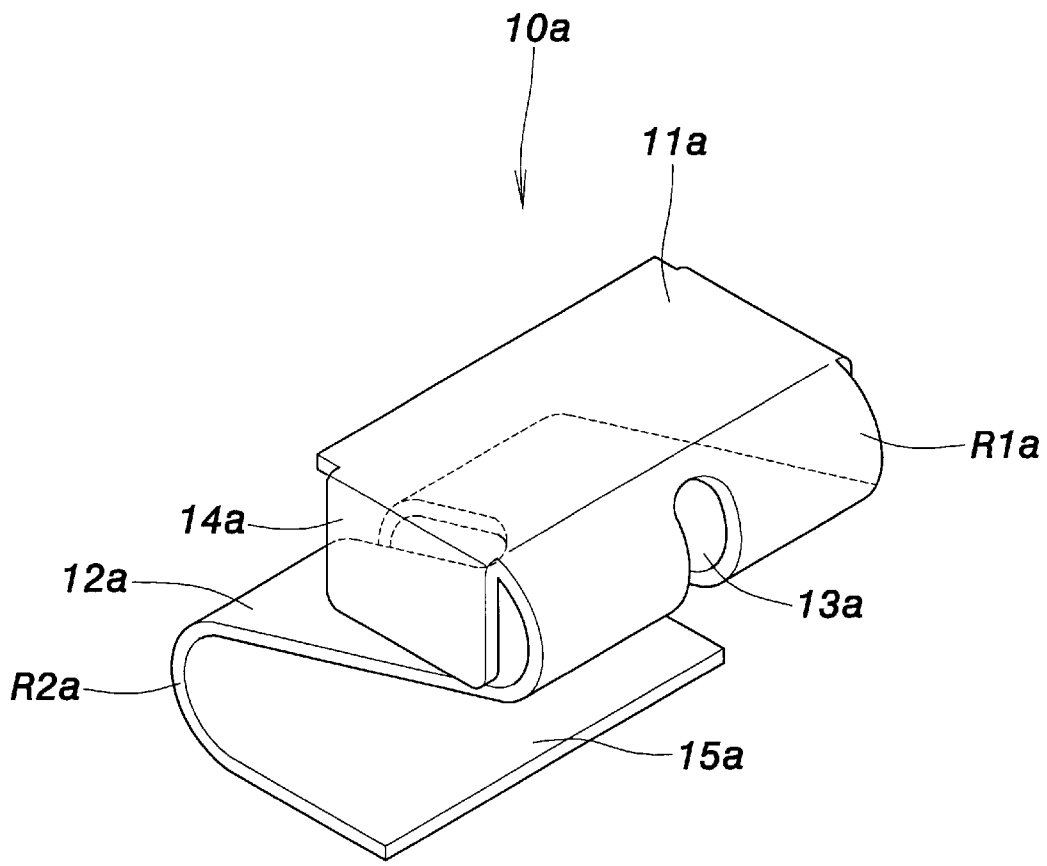
FIG. 1 is a perspective view of an EMI protective spring plate constructed according to the prior art.
Figure 2:
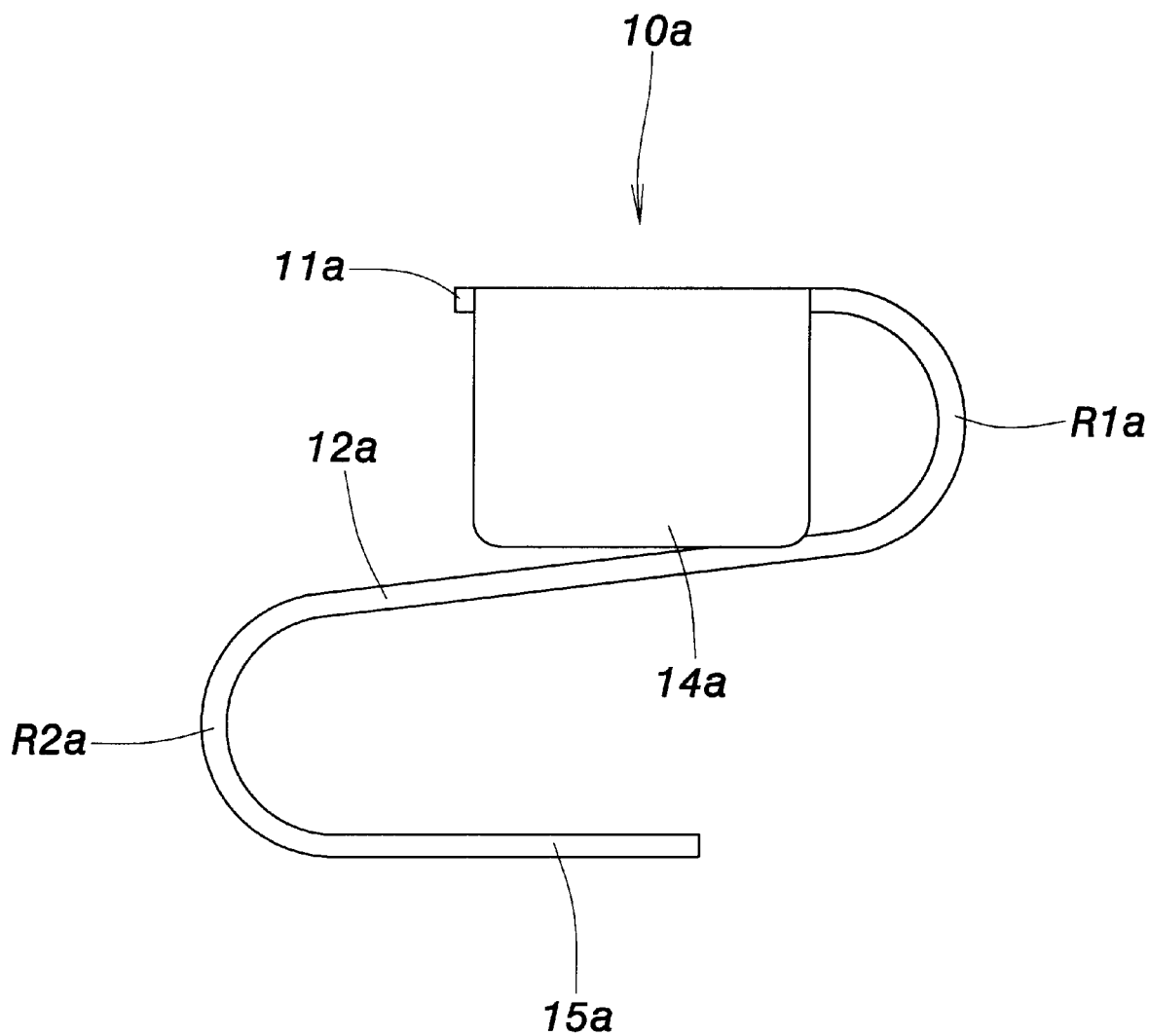
FIG. 2 is a side view of the prior art EMI protective spring plate shown in FIG. 1.
Figure 3:
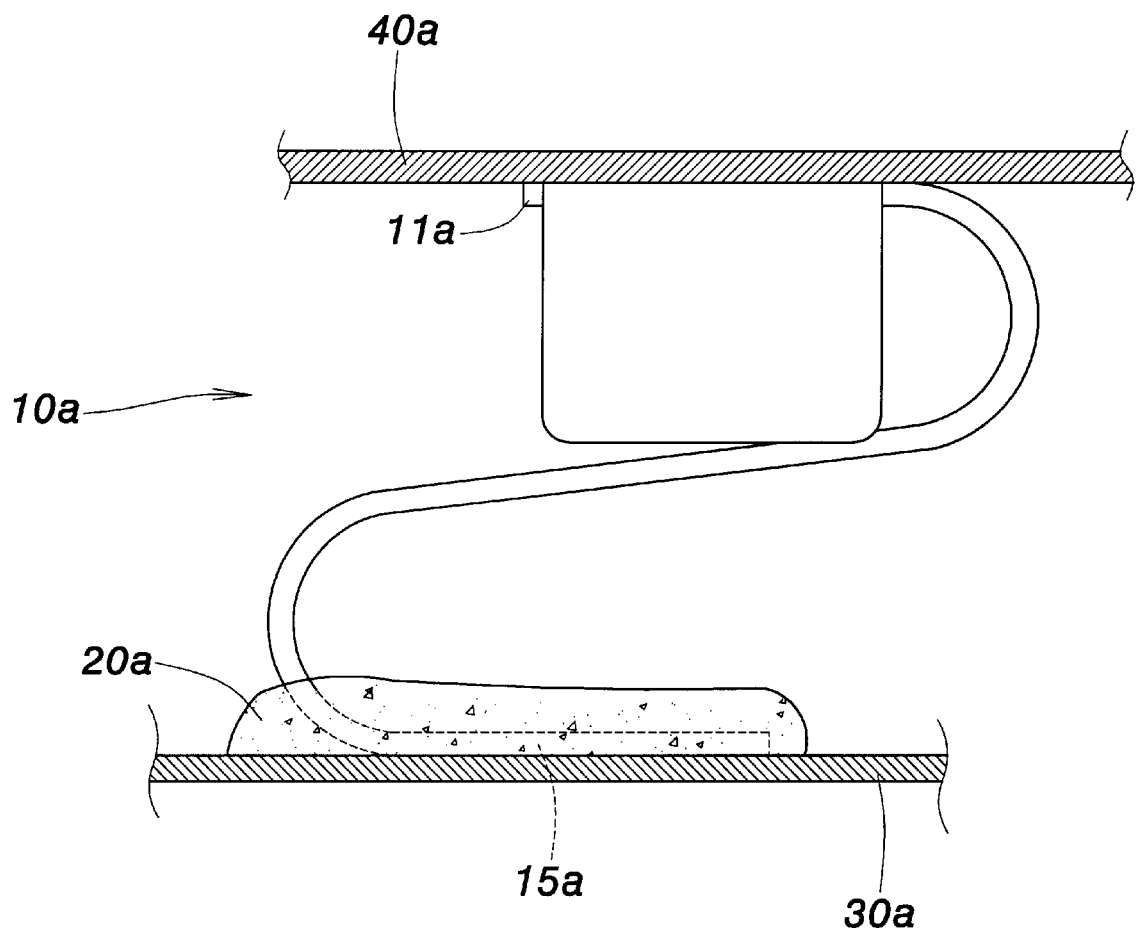
FIG. 3 is a sectional view showing the prior art EMI protective spring plate installed.
Figure 4:
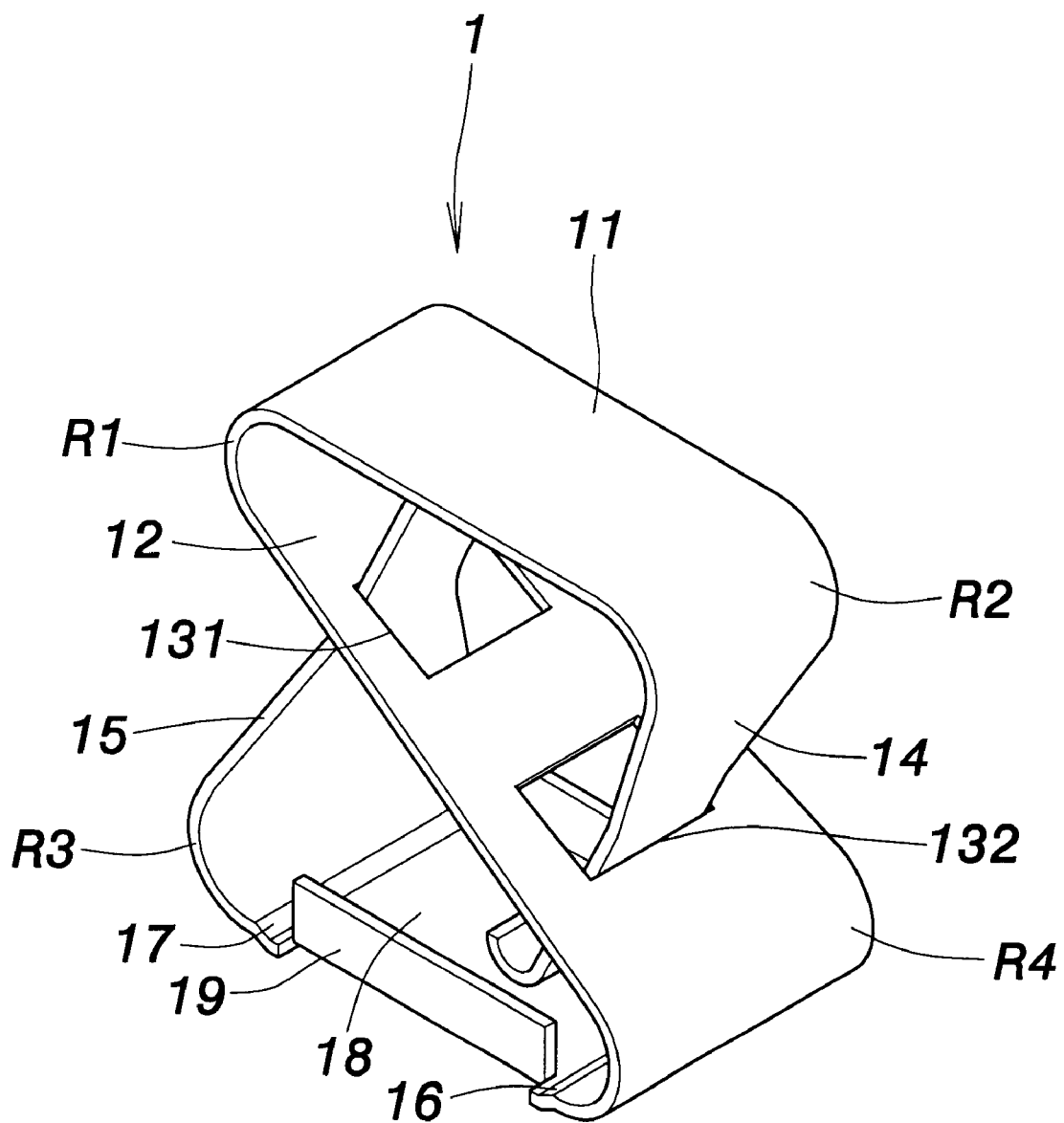
FIG. 4 is a perspective view of an EMI protective spring plate constructed according to the present invention.
Figure 5:
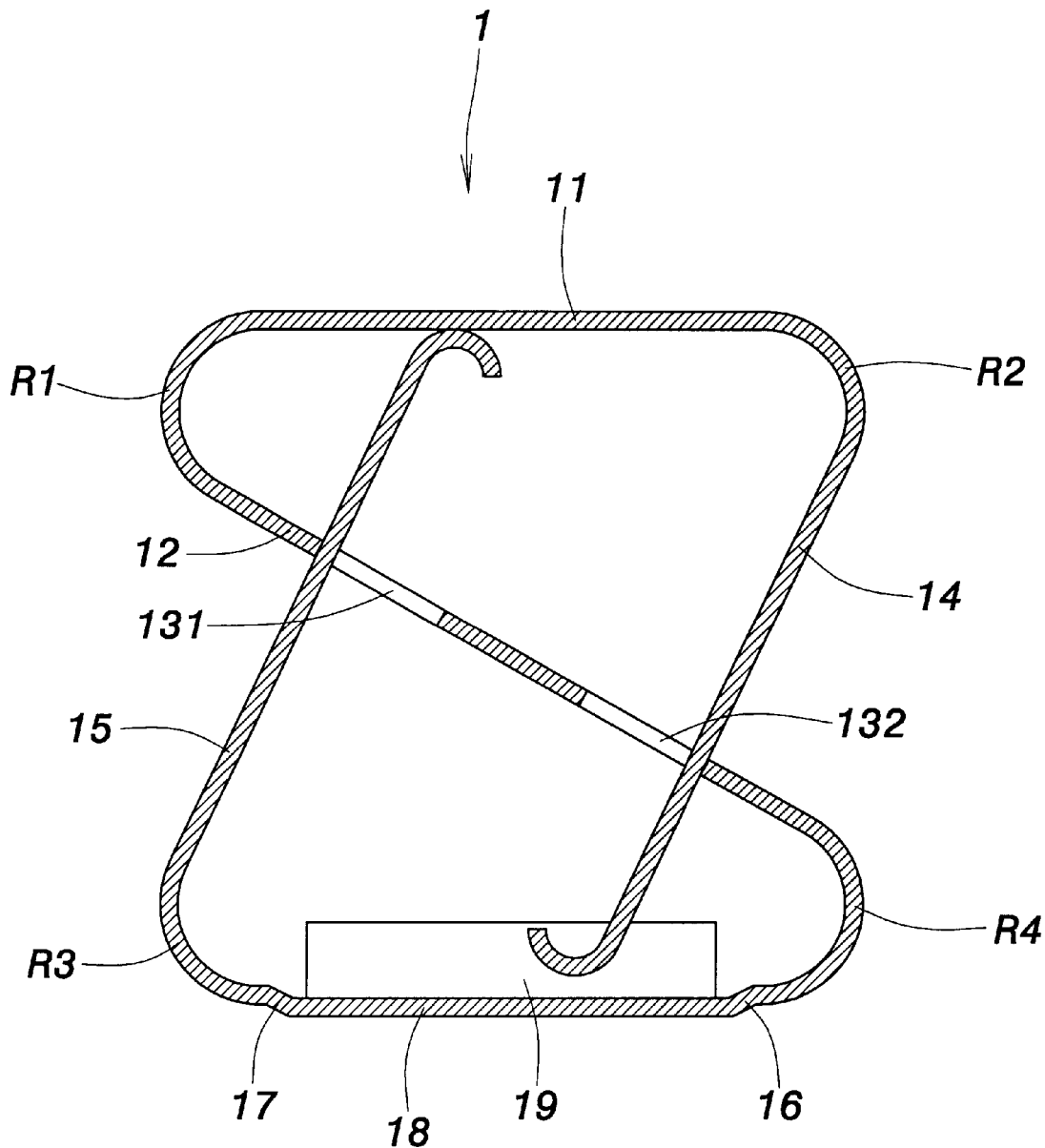
FIG. 5 is a sectional view of the EMI protective spring plate according to the present invention.
Figure 6:
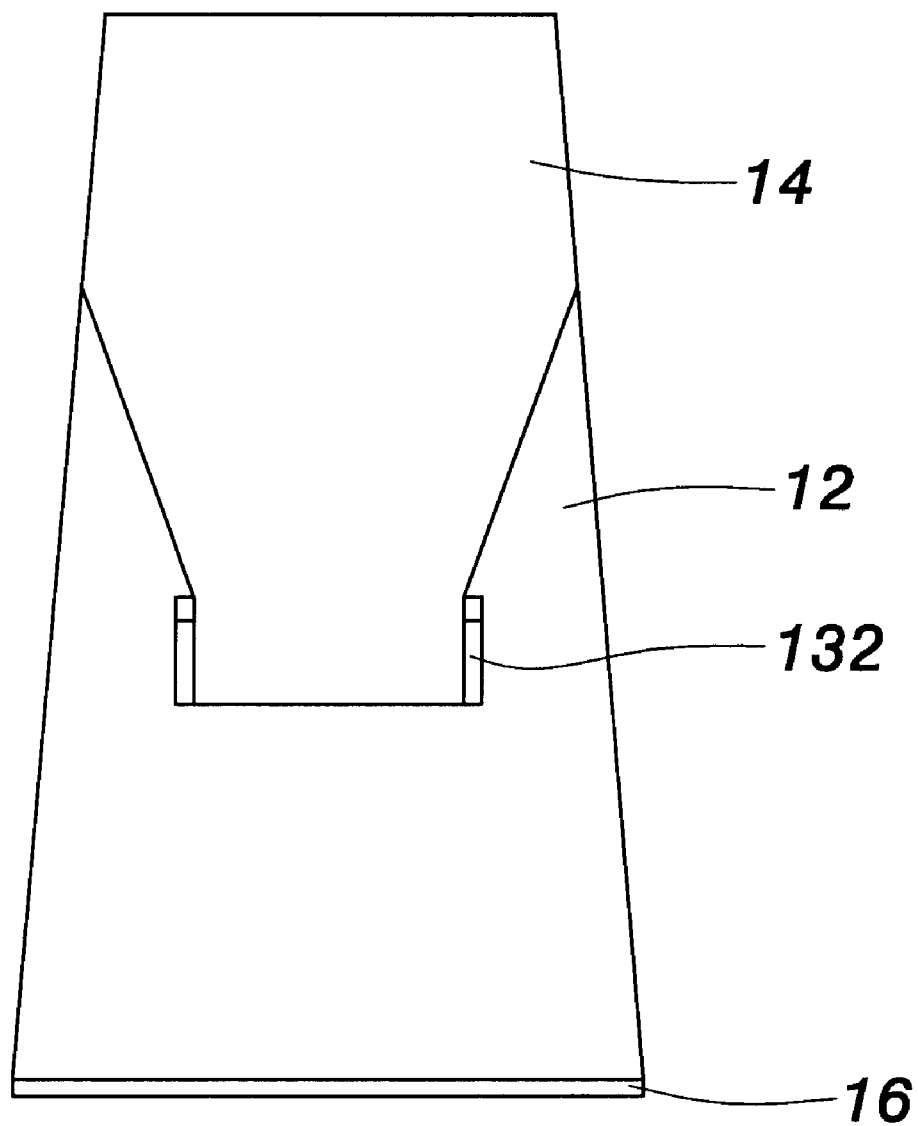
FIG. 6 is a front view of the EMI protective spring plate according to the present invention.
Figure 7:
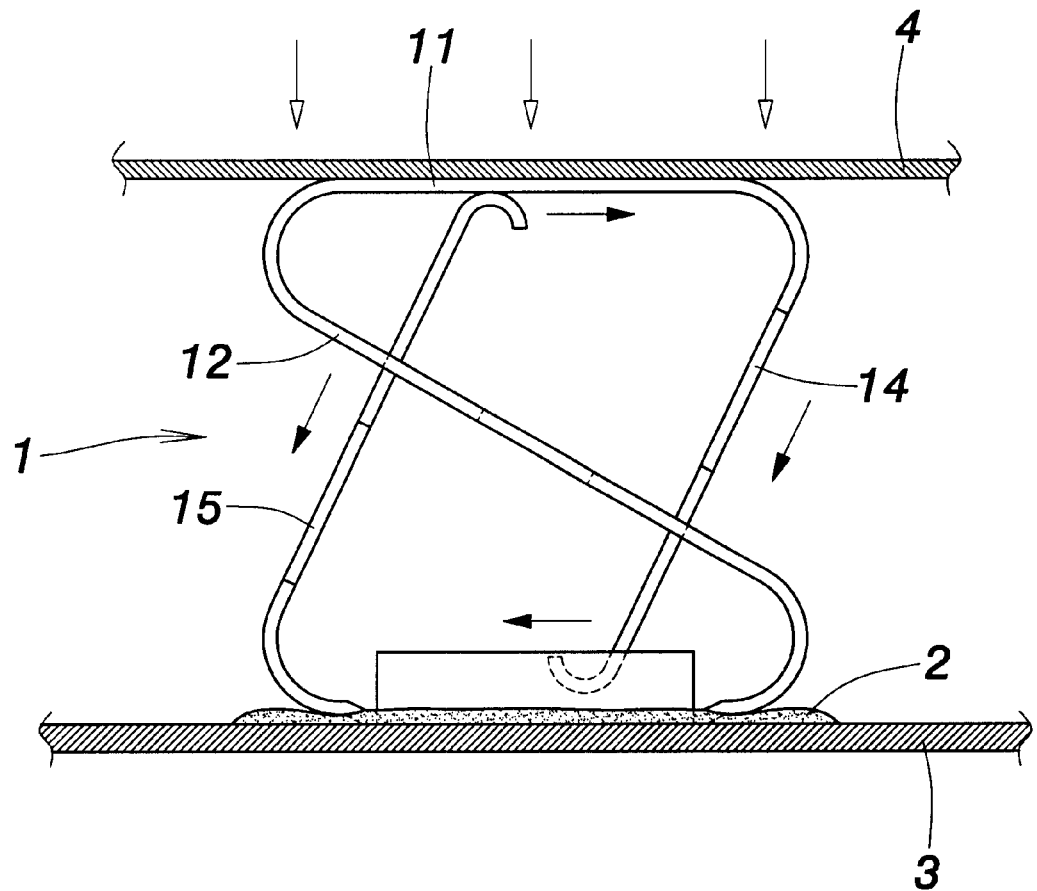
FIG. 7 is a sectional view showing the EMI protective spring plate installed according to the present invention.

Referring to FIGS. From 4 through 7, an EMI protective spring plate 1 is shown comprising a flat top contact portion 11, which supports a shielding cover plate 4 (see FIG. 7), a flat bottom soldering portion 18, which is soldered to a motherboard 3, an oblique supporting portion 12 diagonally connected between one end, namely, the rear end of the flat top contact portion 11 and one end, namely, the front end of the flat bottom soldering portion 18, a first turn R1 connected between the rear end of the flat top contact portion 11 and one end, namely, the top end of the oblique supporting portion 12, an upper slot 131 and a lower slot 132 respectively formed in the oblique supporting portion 12 at different elevations, a front sliding portion 14 obliquely downwardly extended from one end, namely, the front end of the flat top contact portion 11 toward the flat bottom soldering portion 18 and inserted through the lower slot 132, a second turn R2 connected between the front end of the flat top contact portion 11 and one end of the front sliding portion 14, a rear sliding portion 15 obliquely upwardly extended from one end, namely, the rear end of the flat bottom soldering portion 16 toward the flat top contact portion 11 and inserted through the upper slot 131, a third turn R3 connected between the rear end of the flat bottom soldering portion 18 and one end of the rear sliding portion 15, a fourth turn R4 connected between one end, namely, the bottom end of the oblique supporting portion 12 and one end, namely, the front end of the flat bottom soldering portion 18, a first slope 16 formed in the connection area between the fourth turn R4 and the front end of the flat bottom soldering portion 18, and a second slope 17 formed in the connection area between the third turn R3 and the rear end of the flat bottom soldering portion 18. The first slope 16 and the second slope 17 distribute accumulated stress of the tin soldering paste 2, the third turn R3, and the fourth turn R4 in different directions upon a downward applied to the flat top contact portion 11. Preferably, the free end (bottom end) of the front sliding portion 14 and the free end (top end) of the rear sliding portion 15 are respectively rolled up. The front sliding portion 14 has a width gradually reducing from its top end toward its bottom end (i.e., gradually reducing in direction from the flat top contact portion 11 toward the flat bottom soldering portion 18). The rear sliding portion 15 has a width gradually reducing from its bottom end toward its top end (i.e., gradually reducing in direction from the flat bottom soldering portion 18 toward the flat top contact portion 11). The free end (top end) of the rear sliding portion 15 is disposed in contact with the bottom surface of the flat top contact portion 11. The free end (bottom end) of the front sliding portion 14 is spaced above the flat bottom soldering portion 18. The spring plate 1 further comprises two upright baffles 19 formed integral with two opposite lateral sides of the flat bottom soldering portion 18, which stops tin soldering paste 2 from falling to the top surface of the flat bottom soldering portion 18 when soldering the flat bottom soldering portion 18 to the motherboard 3.

Figure 8:
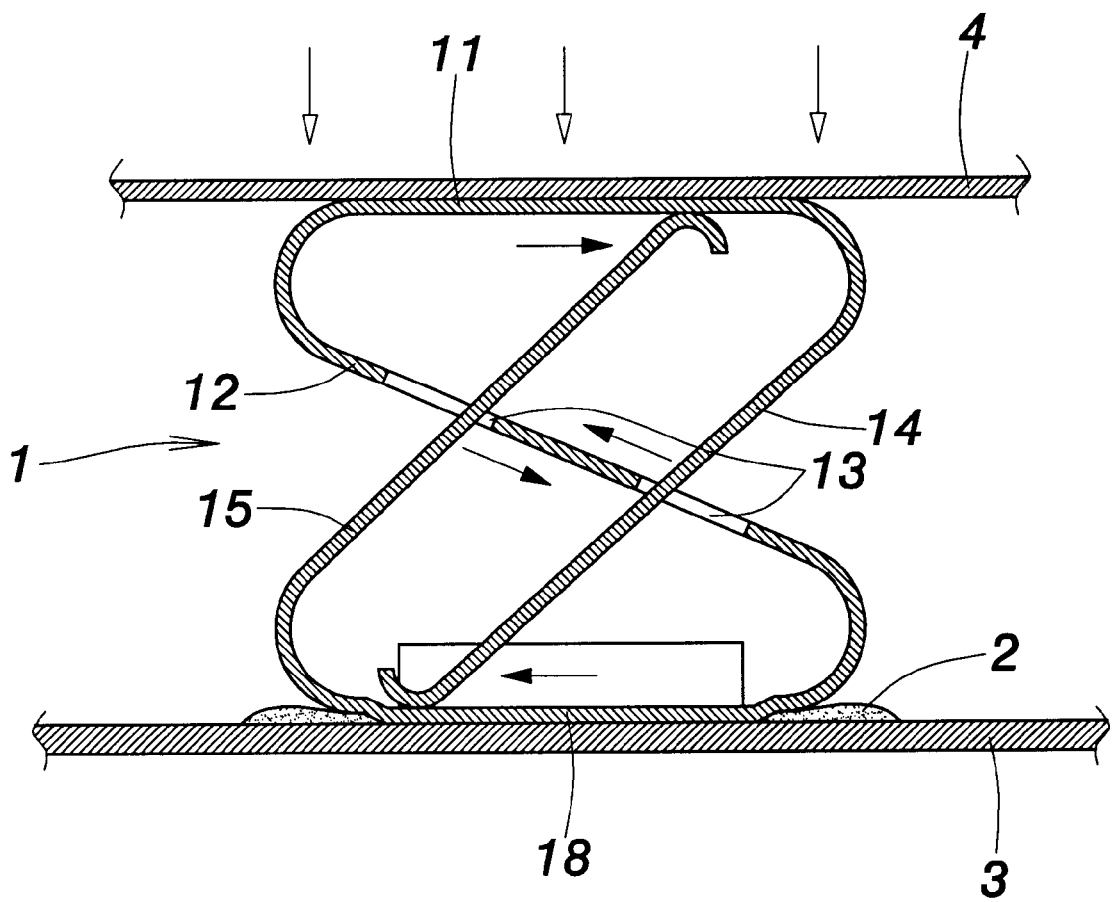
FIG. 8 is similar 6 to FIG. 7 but showing a downward pressure given to the EMI protective spring plate according to the present invention.

Referring to FIG. 8 when loading the shielding cover plate 4 on the flat top contact portion 11 of the spring plate 1 after the flat bottom soldering portion 18 of the spring plate 1 has been soldered to the motherboard 3, the rear sliding portion 15 is forced to turn inwards and to move its free end forwards along the bottom surface of the flat top contact portion 11, and the front sliding portion 14 is forced to move downwards and then to turn inwards, causing the free end of the front sliding portion 14 to be moved backwards along the top surface of the flat bottom soldering portion 18. The slot 131 or 132 has a width wider than the free end of the sliding portion 14 or 15 but narrower than the fixed end of the sliding portion 14 or 15. Therefore, the slots 131;132 limit the sliding distance of the sliding portions 14;15, preventing the spring plate 1 from being excessively deformed. This is the so-called lower dead point design. Because the spring plate 1 has an enclosed structure (the free end of the front sliding portion and the free end of the rear sliding portion are kept from touching external objects), the spring plate 1 does not hook external objects during its installation. Because two turns are provided at the two ends of the flat top contact portion 11, the flat top contact portion 11 is maintained in balance and prohibited from sloping in one direction upon loading of the shielding plate 4. Therefore, the shielding plate 4 can be stably supported on the flat top contact portion 11. Further, the lower dead point design prevents protects the spring plate 1 from being deformed excessively.

A prototype of EMI protective spring plate has been constructed with the features of FIGS. from 4 through 8. The EMI protective spring plate functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An EMI (electromagnetic interference) protective spring plate comprising:

a flat top contact portion adapted to support an EMI (electromagnetic interference) protective shielding cover plate, said flat top contact portion having a front end and a rear end;

a flat bottom soldering portion adapted to be soldered to a motherboard, said flat bottom soldering portion having a front end and a rear end;

an oblique supporting portion diagonally connected between the rear end of said flat top contact portion and the front end of said flat bottom soldering portion, said oblique supporting portion having a top end and a bottom end;

a first turn connected between the rear end of said flat top contact portion and the top end of said oblique supporting portion;

an upper slot and a lower slot respectively formed in said oblique supporting portion at different elevations;

a front sliding portion obliquely downwardly extended from the front end of said flat top contact portion toward said flat bottom soldering portion and inserted through said lower slot, said front sliding portion having wider fixed top end connected to said flat top contact portion and a narrower free bottom end;

a second turn connected between the front end of said flat top contact portion and the top end of said front sliding portion;

a rear sliding portion obliquely upwardly extended from the rear end of said flat bottom soldering portion toward said flat top contact portion and inserted through said upper slot, said rear sliding portion having a wider fixed bottom end connected to the rear end of said flat bottom soldering portion and a narrower free top end;

a third turn connected between the rear end of said flat bottom soldering portion and the fixed bottom end of said rear sliding portion; and a fourth turn connected between the bottom end of said oblique supporting portion and the front end of said flat bottom soldering portion.

2. The EMI protective spring plate of claim 1 wherein the bottom end of said front sliding portion is disposed in contact with a top surface of said flat bottom soldering portion.

3. The EMI protective spring plate of claim 1 wherein the bottom end of said front sliding portion is spaced above said flat bottom soldering portion.

4. The EMI protective spring plate of claim 1 wherein the top end of said rear sliding portion is disposed in contact with a bottom surface of said flat top contact portion.

5. The EMI protective spring plate of claim 1 wherein the top end of said rear sliding portion is spaced below said flat top contact portion.

6. The EMI protective spring plate of claim 1 wherein said lower slot has a width narrower than the wider top end of said front sliding portion but wider than the narrower bottom end of said front sliding portion.

7. The EMI protective spring plate of claim 1 wherein said upper slot has a width narrower than wider bottom end of said rear sliding portion but wider than the narrower top end of said rear sliding portion.

8. The EMI protective spring plate of claim 1 wherein the bottom end of said front sliding portion is rolled up.

9. The EMI protective spring plate of claim 1 wherein the top end of said rear sliding portion is rolled up.

10. The EMI protective spring plate of claim 1 further comprising two upright baffles disposed at two opposite lateral sides of said flat bottom soldering portion.

11. The EMI protective spring plate of claim 1 further comprising a first slope formed in the connection area between said fourth turn and said flat bottom soldering portion, and a second slope formed in the connection area between said third turn and said flat bottom soldering portion.

* * * * *